United States Patent
Sakurada et al.

(10) Patent No.: US 6,913,646 B2
(45) Date of Patent: Jul. 5, 2005

(54) SILICON SINGLE CRYSTAL WAFER AND METHOD FOR PRODUCING SILICON SINGLE CRYSTAL

(75) Inventors: Masahiro Sakurada, Fukushima (JP); Takeshi Kobayashi, Fukushima (JP); Tatsuo Mori, Fukushima (JP); Izumi Fusegawa, Fukushima (JP); Tomohiko Ohta, Fukushima (JP)

(73) Assignee: Shin-Etsu Handotai Co., Ltd., Toyko (JP)

( * ) Notice: Subject to any disclaimer, the term of this patent is extended or adjusted under 35 U.S.C. 154(b) by 3 days.

(21) Appl. No.: 10/204,935
(22) PCT Filed: Dec. 26, 2001
(86) PCT No.: PCT/JP01/11492
§ 371 (c)(1), (2), (4) Date: Aug. 27, 2002
(87) PCT Pub. No.: WO02/053812
PCT Pub. Date: Jul. 11, 2002

(65) Prior Publication Data
US 2003/0116082 A1 Jun. 26, 2003

(30) Foreign Application Priority Data
Dec. 28, 2000 (JP) .................................... 2000-403127

(51) Int. Cl.[7] ............................................. C30B 15/20
(52) U.S. Cl. ......................... 117/13; 117/14; 117/15; 117/20; 117/932
(58) Field of Search ............................. 117/13, 14, 15, 117/20, 932

(56) References Cited

U.S. PATENT DOCUMENTS

| 6,048,395 A | * | 4/2000 | Iida et al. ................. 117/20 |
| 6,190,452 B1 | * | 2/2001 | Sakurada et al. .......... 117/20 |
| 2001/0000093 A1 | * | 4/2001 | Sakurada et al. .......... 117/13 |

FOREIGN PATENT DOCUMENTS

| EP | 0964082 | 12/1999 |
| JP | 04-192345 | 7/1992 |
| JP | 11-236293 | 8/1999 |

OTHER PUBLICATIONS

V.V. Voronlov, "The Mechanism of Swirl Defects Formation in Silicon", Journal of Crystal Growth, vol. 59, 1982, pp. 625–643.

Shinsuke Sadamitsu et al., "Dependence of the Grown–in Defect Distribution on Growth Rates in Czochralski Silicon", Japanese Journal of Appl. Phys. vol. 32, 1993, pp. 3675–3681.

* cited by examiner

Primary Examiner—Robert Kunemund
(74) Attorney, Agent, or Firm—Hogan & Hartson, LLP

(57) ABSTRACT

There can be provided a silicon single crystal wafer grown according to Czochralski method wherein the whole plane of the wafer is occupied by N region on the outside of OSF generated in a shape of a ring by thermal oxidation treatment and there exists no defect region detected by Cu deposition. Thereby, there can be produced a silicon single crystal wafer according to CZ method, which does not belong to any of V region rich in vacancies, OSF region and I region rich in interstitial silicons, and can surely improve electric characteristics such as oxide dielectric breakdown voltage characteristics or the like under stable manufacture conditions.

10 Claims, 7 Drawing Sheets

F I G. 1
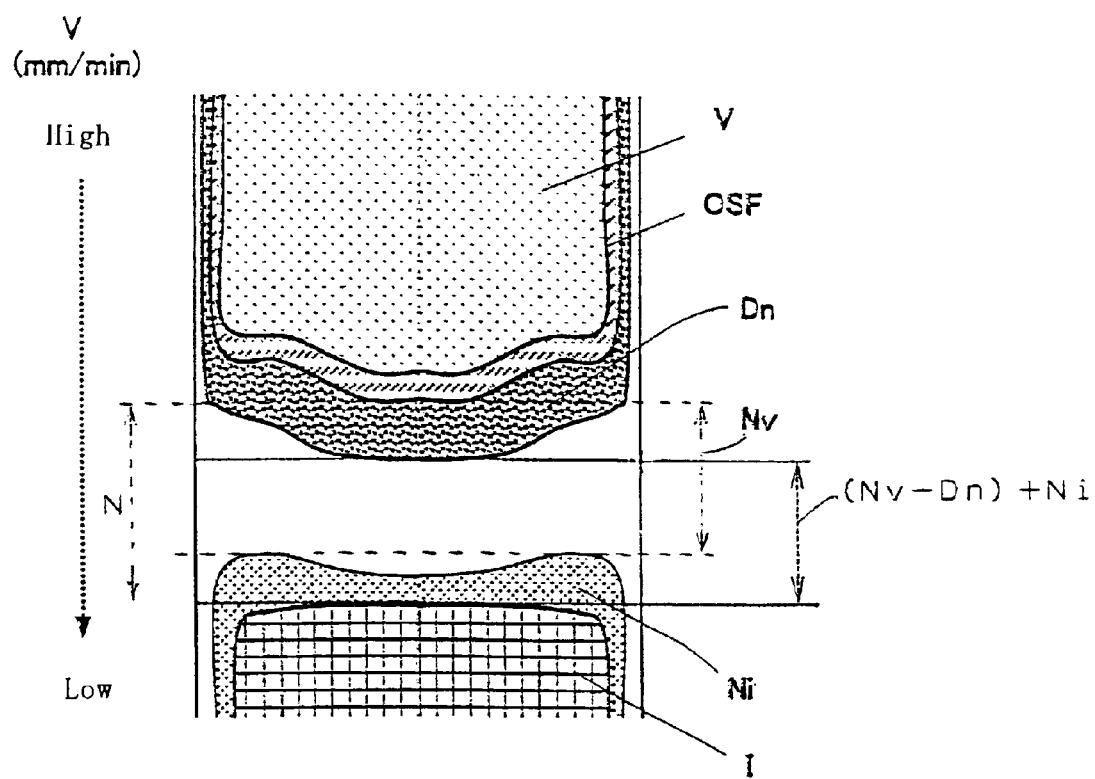

(a)

(b)

(a)

(b)

(a)

(b)

US 6,913,646 B2

SILICON SINGLE CRYSTAL WAFER AND METHOD FOR PRODUCING SILICON SINGLE CRYSTAL

TECHNICAL FIELD

The present invention relates to a silicon single crystal wafer with high breakdown voltage and excellent electrical characteristics, in which any of defect regions such as V region, OSF region and I region as described below are not present, and in which oxide-film defects detected by copper deposition treatment are not formed, and a method for producing the silicon single crystal.

BACKGROUND TECHNOLOGY

In recent years, a demand for quality of a silicon single crystal produced by Czochralski method (hereafter abbreviated to CZ method) used as a substrate has been increasing due to decrease in size of a device resulting from increased degree of integration of a semiconductor circuit. There exist defects introduced during growth of a single crystal called grown-in defects such as FPD, LSTD and COP, which degrade oxide dielectric breakdown voltage characteristics and device characteristics. It has been considered that it is important to decrease a density and a size thereof.

For explanation of the above-mentioned defects, first are described general matters known as for factors which determine a concentration of point defects called vacancy (hereinafter occasionally referred to as V) and a concentration of point defects called interstitial silicon (Interstitial-Si, hereinafter occasionally referred to as I).

In a silicon single crystal, V region refers to a region which contains a large amount of vacancies, i.e., depressions, pits, or the like caused by lack of silicon atoms; and an I region refers to a region which contains a large amount of dislocations caused by existence of excess silicon atoms or a large amount of clusters of excess silicon atoms. Further, between the V region and the I region, there exists a neutral (hereinafter occasionally referred to as N) region which contains no (or little) surplus or no (or little) shortage of silicon atoms. Recent studies have revealed that the above-mentioned grown-in defects (such as FPDs, LSTDs and COPs) are generated only when V or I are present in a supersaturated state and that even when some atoms are unevenly distributed, they do not appear as a defect so long as V and I do not exceed the saturation level.

It has been confirmed that a concentration of each of these point defects depends on the relation between a pulling rate (growth rate) of the crystal in CZ method and a temperature gradient G near a solid-liquid interface of the crystal, and that another type of defect called oxidation-induced stacking fault (hereinafter occasionally referred to as OSF) is present in a ring-shape distribution near a boundary between V region and I region, when the cross section perpendicular to the axis of crystal growth is observed.

When a crystal is pulled through use of a CZ pulling apparatus with a furnace structure having a large temperature gradient G near a solid-liquid interface of the crystal (hereinafter occasionally referred to as hot zone: HZ) with growth rates varying from high speed to a low speed along the crystal axis, these defects introduced during the crystal growth exist as in a distribution chart of defects shown in FIG. 7.

These defects introduced during the crystal growth can be classified as follows. When the growth rate is relatively high, for example, about 0.6 mm/min or higher, grown-in defects such as FPDs, LSTDs and COPs which are considered to be generated due to voids consisting of aggregated vacancy-type point defects are present at a high density over the entire radial cross section of the crystal. The region where these defects are present is called V region (See FIG. 7, line (A)). When a growth rate is not higher than 0.6 mm/min, the OSF ring is generated with decrease of the growth rate, from a circumferential portion of the crystal. If the growth rate is decreased further, a diameter of the ring shrinks, and defects of L/D (large dislocation, abbreviation of interstitial dislocation loop, LSEPD, LFPD or the like) which are considered to be generated due to dislocation loop are present at a low density outside the ring. The region where these defects are present is called I region (hereinafter occasionally referred to as L/D region). Furthermore, when the growth rate is decreased to about 0.4 mm/min or less, the OSF ring shrinks to the center of a wafer and disappears, so that the I region spreads over the entire plane of the wafer (See FIG. 7, line (C)).

Furthermore, there has been recently found existence of a region, called N region, where there is located between the V region and the I region and outside the OSF ring, and where there exists neither defects due to vacancies such as FPDs, LSTDs and COPs nor defects due to a dislocation loop such as LSEPDs and LFPDs. It has been reported that located outside the OSF ring is the region where substantially no oxygen precipitation occurs when a single crystal is subjected to a heat treatment for oxygen precipitation and the contrast due to precipitates is observed through use of an X-ray beam or the like, and that the region is on an I region side and is not rich enough to cause formation of LSEPDs and LFPDs (See FIG. 7, line (B)).

Since these N regions exist inclining from growth axis when a growth rate is lowered in the case of general methods, they exist only in a part of a plane of the wafer.

According to the Voronkov theory (V. V. Voronkov; Journal of Crystal Growth, 59 (1982) 625–643), it is proposed as for N region that a total concentration of a point defect is defined by a parameter called V/G which is the ratio of a pulling rate (V) and a temperature gradient (G) along the axis direction in the crystal solid-liquid interface. Considering the above theory, only a crystal wherein V region exists at a center and I region exist around it over N region can be obtained at a certain pulling rate, since a pulling rate is constant in a plane and G is distributed in the plane.

Recently, it is proposed that the N-region which could exist only slantwise is enlarged by improving distribution of G within a plane. For example, when a crystal is pulled with decreasing a pulling rate V gradually, the crystal in which the N region spread horizontally over the whole plane can be obtained at a certain pulling rate. Enlargement of the crystal having N region spreading horizontally over the whole plane into a direction of length can be achieved to some extent by maintaining the pulling rate at which the N region spreads horizontally. By controlling a pulling rate so that V/G value may be constant with considering that G is varied with growth of the crystal and calibrating it, the crystal having the N region over the whole plane can be enlarged into a direction of growth to some extent.

The N region can be classified into Nv region (the region where a lot of vacancies exist) adjacent to the outside of OSF ring and Ni region (the region where a lot of interstitial silicons exist) adjacent to I region. It has been found that a lot of oxide precipitates are generated in the Nv region when thermal oxidation treatment is carried out, and that there is almost no oxide precipitates are generated in the Ni region.

However, it has been found that an oxide-film defects may occur remarkably, even if it is a crystal such as the above-mentioned single wherein the N region occupies the whole plane, an OSF ring is not generated when thermal oxidation treatment is carried out, and FPD and L/D do not exist in the whole plane. This may be a cause of degrading electrical characteristics such as oxide dielectric breakdown voltage characteristics. Accordingly, the fact that the N region occupies whole plane as in a conventional crystal is not enough, and the further improvement has been desired.

DISCLOSURE OF THE INVENTION

The present invention has been made in order to solve such problems. The object of the present invention is to provide a silicon single crystal wafer according to CZ method, which does not belong to any of V region rich in vacancies, OSF region and I region rich in interstitial silicons, and can surely improve electric characteristics such as oxide dielectric breakdown voltage characteristics or the like under stable manufacture conditions.

To achieve the above mentioned object, the present invention provides a silicon single crystal wafer grown according to Czochralski method wherein the whole plane of the wafer is occupied by N region on the outside of OSF generated in a shape of a ring by thermal oxidation treatment and there exists no defect region detected by Cu deposition.

As described above, since the silicon single crystal wafer according to the present invention is a defect-free wafer wherein the whole plane of the wafer is occupied by N region on the outside of OSF generated in a shape of a ring by thermal oxidation treatment and there exists no defect region detected by Cu deposition, it is a silicon wafer having high quality which does not degrade electric characteristics such as oxide dielectric breakdown voltage characteristics or the like when a device is fabricated thereon.

The second embodiment of the present invention also provides a silicon single crystal wafer grown according to Czochralski method wherein the whole plane of the wafer is occupied by N region on the outside of OSF generated in a shape of a ring by thermal oxidation treatment and there exist in the whole plane of the wafer neither a defect region detected by Cu deposition nor Ni region where oxygen precipitation is hardly caused.

As described above, since the silicon single crystal wafer according to the present invention is a defect-free wafer wherein the whole plane of the wafer is occupied by N region on the outside of OSF generated in a shape of a ring by thermal oxidation treatment and there exist in the whole plane of the wafer neither a defect region detected by Cu deposition nor Ni region where oxygen precipitation is hardly caused, it does not degrade electric characteristics such as oxide dielectric breakdown voltage characteristics or the like when a device is fabricated thereon, and has a high gettering performance.

Next, a method for producing a silicon single crystal according to the present invention is a method for producing a silicon single crystal according to Czochralski method wherein the crystal is grown in a defect-free region which is N region on the outside of OSF generated in a shape of a ring when the grown silicon single crystal wafer is subjected to thermal oxidation treatment in which a defect region detected by Cu deposition does not exist.

The present invention also provides a method for producing a silicon single crystal by Czochralski method wherein the crystal is grown with controlling a growth rate between the growth rate of the boundary where the defect region detected by Cu deposition remaining after disappearance of OSF ring is disappeared when gradually decreasing a growth rate of silicon single crystal during pulling and the growth rate of the boundary where interstitial dislocation loop is generated when a growth rate is gradually lowered further.

According to these methods, there can be produced a defect-free silicon single crystal wafer occupied by N region on the outside of OSF generated in a shape of a ring by thermal oxidation treatment in which no defect region detected by Cu deposition exists which degrades electric characteristics such as oxide dielectric breakdown voltage characteristics or the like.

The second embodiment of the method for producing a silicon single crystal according to the present invention is a method of growing a silicon single crystal by Czochralski method wherein the crystal is grown in the region which is N region on the outside of OSF generated in a shape of a ring by thermal oxidation treatment in which neither defect region detected by Cu deposition nor Ni region where oxygen precipitation is hardly caused exists.

In addition, the present invention also relates to a method for producing a silicon single crystal according to the present invention is a method of growing a single crystal by Czochralski method wherein the crystal is grown with controlling a growth rate between the growth rate of the boundary where the defect region detected by Cu deposition remaining after disappearance of OSF ring is disappeared when gradually decreasing a growth rate of silicon single crystal during pulling and the growth rate of the boundary where the Ni region in which oxygen precipitation is hardly caused is generated when a growth rate is gradually lowered further.

According to these method for producing, the defect-free silicon single crystal wafer can be produced wherein the whole plane of the wafer is occupied by N region on the outside of OSF generated in a shape of a ring by thermal oxidation treatment and there exists neither a defect region detected by Cu deposition nor Ni region where oxygen precipitation is hardly caused. Accordingly, the crystal excellent in oxide dielectric breakdown voltage and gettering capacity can be obtained.

In these methods for producing, a pulling rate at the time of a crystal growth is preferably 0.5 mm/min or more.

As described above, if a pulling rate at the time of a crystal growth is 0.5 mm/min or more, the manufacturing margin wherein the defect-free region of the present invention, especially the region in which an oxide-precipitates layer is formed is enlarged, and thereby a stable supply can be achieved.

As explained above, according to the present invention, there can be stably provided a silicon single crystal wafer with excellent electrical property and high breakdown voltage, in which there do not exist any of defect regions such as V region, OSF region and I region, and the oxide film defects detected by Cu deposition treatment are not formed.

BRIEF DESCRIPTION OF THE DRAWINGS

FIG. 1 is an explanatory view showing the relation between a growth rate and a crystal defect distribution in the present invention.

(a) apparatus A, (b) apparatus B.

Figure 3:
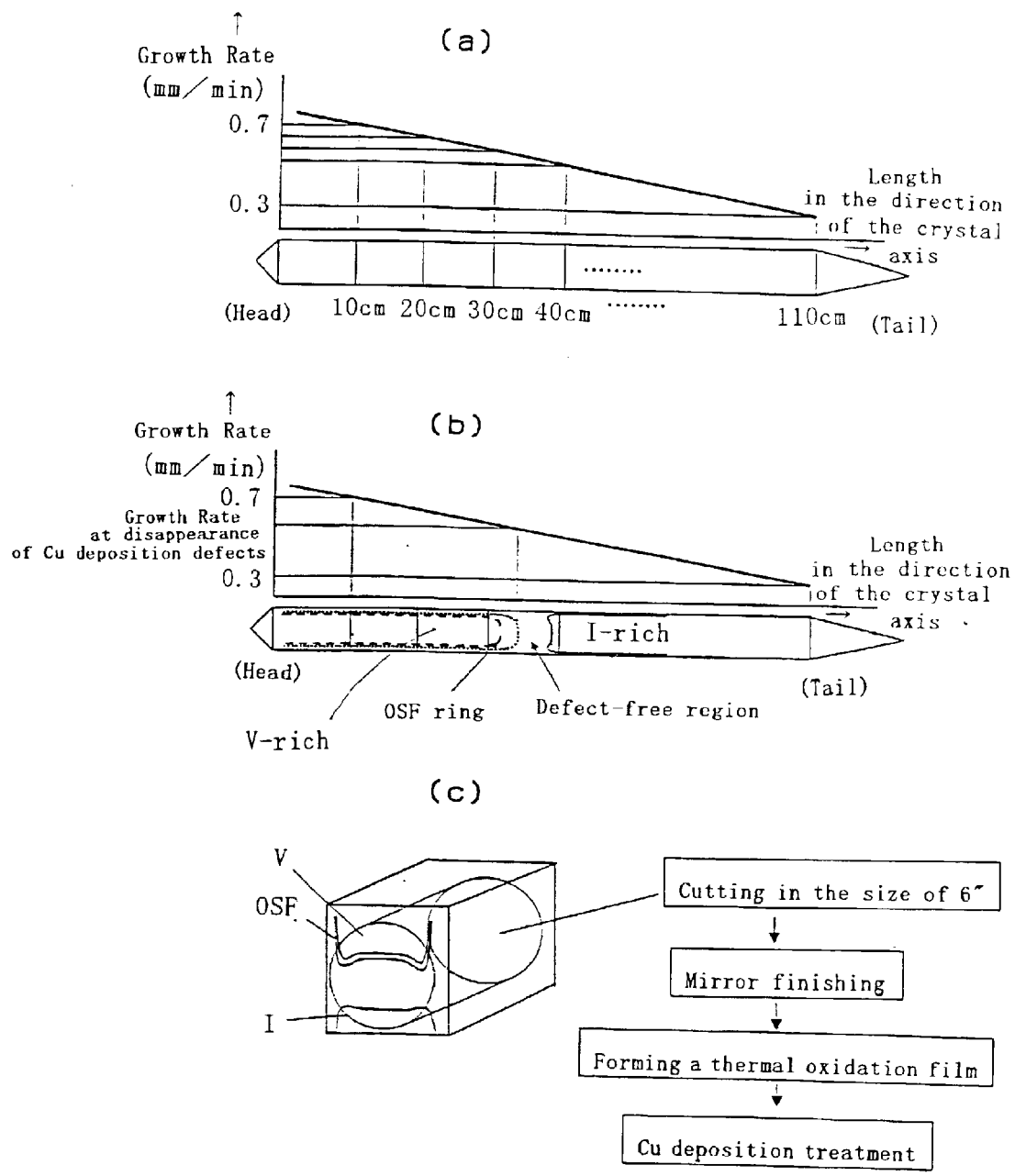

FIG. 3(a) is a view showing the relation between a growth rate of a single crystal and a cutting position of the crystal, (b) is an explanatory view showing the OSF shrinkage velocity at each pulling apparatus, (c) is an explanatory view showing a method for producing a sample for evaluation of Cu deposition.

Figure 4:
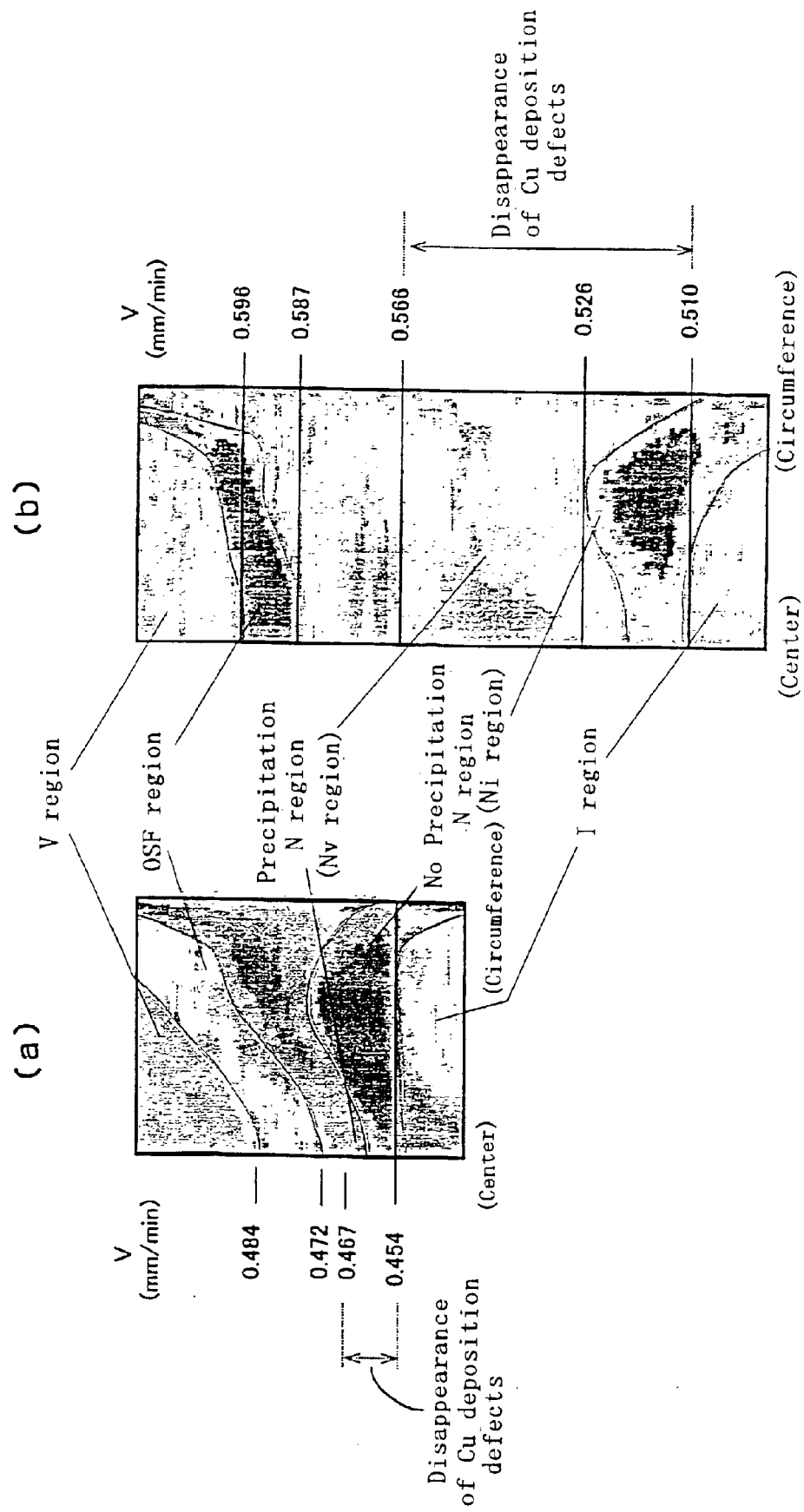

FIG. 4 is a WLT map in a direction of a crystal axis of a single crystal grown with a single crystal pulling apparatus used in the present invention:

(a) apparatus A, (b) apparatus B.

Figure 5:
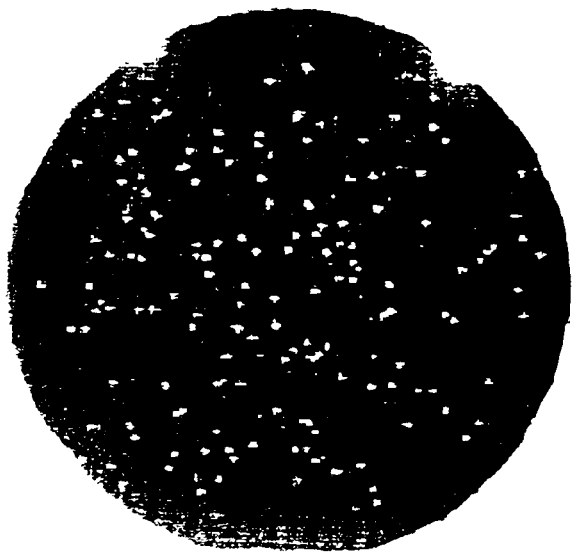
Figure 5:
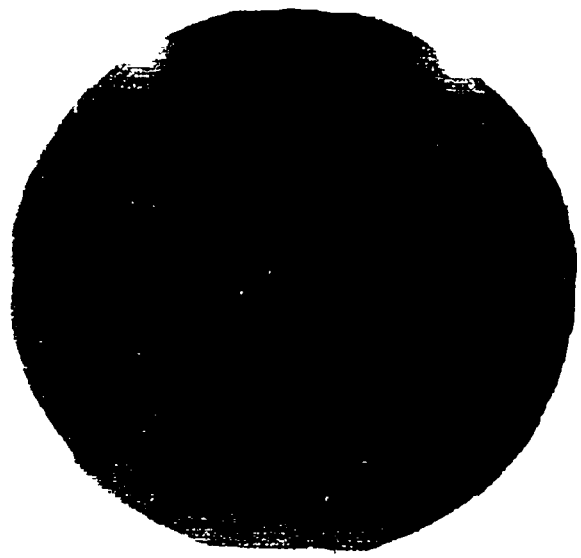

FIG. 5 is a view showing a result of observation of a defect distribution in Nv region by Cu deposition:

(a) oxide film defect region by Cu deposition, (b) Nv region where the oxide film defects do not exist.

Figure 6:
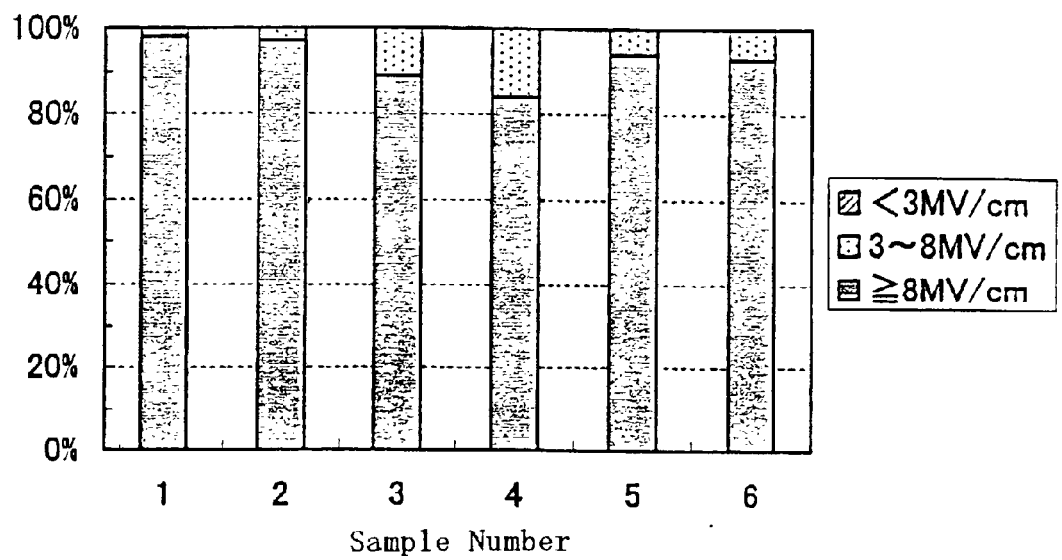
Figure 6:
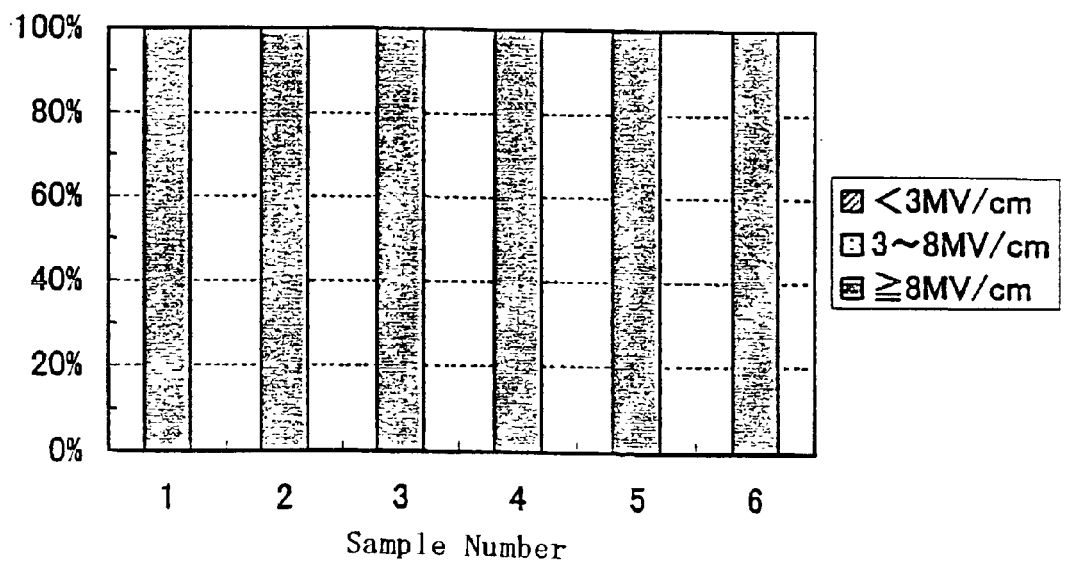

FIG. 6 is a view showing a result of measurement of the oxide dielectric breakdown voltage level in Nv region:

(a) the oxide film defect generating region by Cu deposition, (b) the Nv region where oxide-film defects did not generate.

Figure 7:
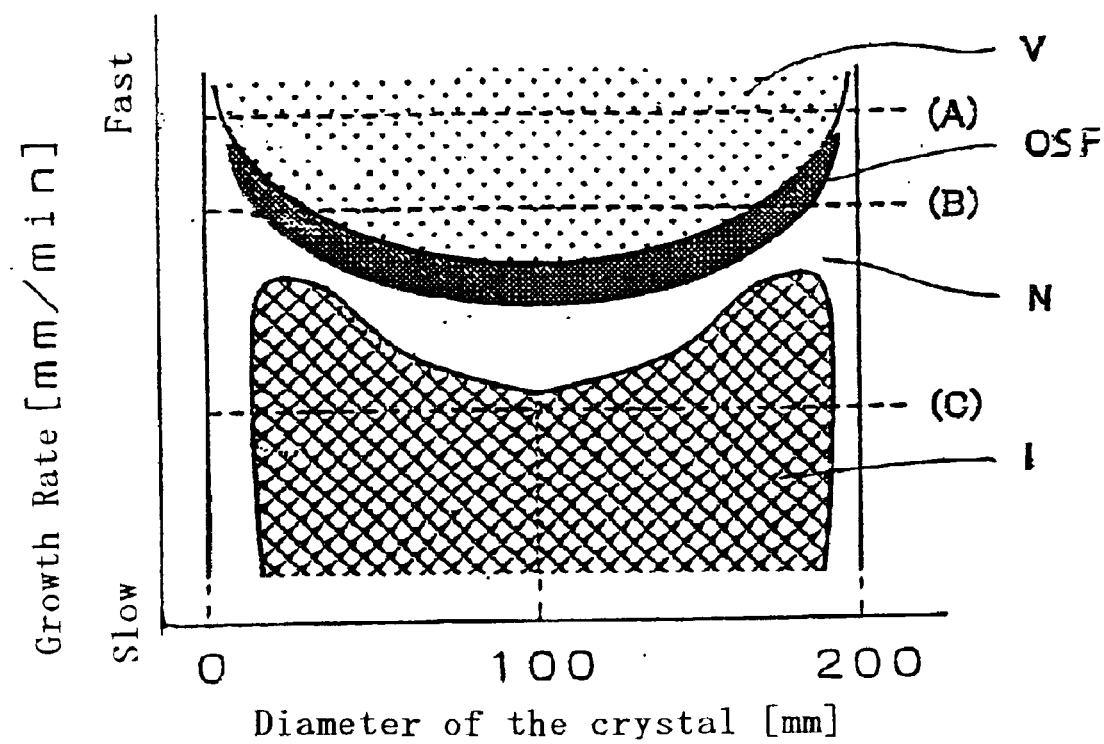

FIG. 7 is an explanatory view showing the relation between a growth rate and a defect distribution of a crystal in the conventional method.

BEST MODE FOR CARRYING OUT THE INVENTION

The present invention will be explained below in detail, but the present invention is not limited thereto.

In advance of the explanation, terms will be explained.

1) FPD (Flow Pattern Defect) denotes flow patterns which, together with pits, are generated in the surface of a wafer which is sliced from a grown silicon single crystal ingot and treated by the steps of: removing a damaged layer from the surface portion of the wafer through etching with a mixed solution of hydrofluoric acid and nitric acid, and etching the wafer surface with a mixed solution of $K_2Cr_2O_7$, hydrofluoric acid and water (Secco etching). As FPD density in the plane of the wafer becomes higher, failure rate with regard to dielectric breakdown strength of oxide film increase (Japanese patent Laid-Open (kokai) No 4-192345).

2) SEPD (Secco Etch Pit Defect) denotes pits which are generated alone in the surface portion of a wafer which is Secco-etched in the same manner as in the case of FPD. Pits accompanied by flow patterns are generically referred to as FPD. Pits not accompanied by flow patterns are generically referred to as SEPD. Large SEPD having a size of 10 $\mu$m or more (LSEPD) conceivably derives from a dislocation cluster. When the dislocation cluster is present in a device, current leaks through the dislocation, consequently, the function of a P-N junction is not effective.

3) LSTD (Laser Scattering Tomography Defect) denotes a defect existing in wafer, and the scattering light due to the defect can be detected in the following manner. That is, a wafer is sliced from a grown silicon single-crystal ingot, and is then treated by the steps of: removing a damaged layer from the surface portion of the wafer through etching with a mixed solution of hydrofluoric acid and nitric acid, and cleaving the wafer. When infrared light is introduced into the wafer through the cleavage plane, and light exiting from the wafer surface is detected, thereby a scattering light due to the defects existing in the wafer can be detected. A scattering defect detected in this observation has already been reported at a meeting of an academic society or the like and is considered to be an oxide precipitate (Jpn. J. Appl. Phys. vol.32, p.3679 1993). According to recent research, LSTD is reported to be an octahedral void.

4) COP(Crystal Originated Particle) denotes a defect which causes degradation of the dielectric breakdown strength of oxide film at a central portion of a wafer and which is revealed as FPD in the case of treatment through Secco etching, but is revealed as COP in the case of cleaning in SC-1 cleaning (cleaning by using a mixed aqueous solution of $NH_4OH:H_2O_2:H_2O=1:1:10$) which serves as a preferential etchant. The pit has a diameter not greater than 1 $\mu$m, which can be examined by a light scattering method.

5) L/D (Large Dislocation; simplified expression of interstitial dislocation loop) denotes defects, such as LSEPD and LFPD, which are considered to be generated due to a dislocation loop. As described above, LSEPD refers to large SEPD having a size not less than 10 $\mu$m, while LFPD refers to FPD whose tip end pit has a size not less than 10 $\mu$m. These are also considered to be generated due to dislocation loops.

6) Cu deposition method is a method for evaluating of a wafer by which position of defects in a semiconductor wafer can be accurately measured, detection limit for defects in a semiconductor wafer can be improved, and finer defects can be accurately measured and analyzed.

The specific evaluation method of a wafer comprises forming an insulator film with a predetermined thickness on the surface of the wafer, destroying the insulator film on the defect part generated near the surface of the wafer, and depositing electrolyte, such as Cu, at the defect part (deposition). That is, the Cu deposition method is an evaluation method using the fact that when electric potential is applied to an oxide film formed on the surface of the wafer in the liquid where Cu ions are dissolved, electric current flows to the part where the oxide film is degraded, and Cu ions are precipitated as Cu. It is known that defects such as COPs exist in the part where an oxide film is apt to be degraded.

The defect part of the wafer where Cu is deposited can be analyzed by observation with the naked eye under a collimated light or directly, to evaluate a distribution and a density thereof. Furthermore, it can also be confirmed by microscope observation, a transmission electron microscope (TEM), a scanning electron microscope (SEM) or the like.

The inventors of the present invention have studied in detail defects generated near a boundary between V region and I region of a silicon single crystal grown according to CZ method, and found that there exists a neutral N region in which the number of FPDs, LSTDs and COPs is considerably low, and no L/D exists between V region and I region and on the outside of OSF ring.

Furthermore, it has been found that the N region can be classified into Nv region (the region containing a lot of vacancies) adjacent to the outside of an OSF ring and Ni region (the region containing a lot of interstitial silicon) adjacent to I region, and a lot of oxide precipitates are generated in the Nv region when thermal oxidation treatment is carried out, and oxygen precipitation is not caused in Ni region.

However, even if the crystal is grown in the above-mentioned N region, some of them is inferior in oxide dielectric breakdown voltage, and the cause thereof has not been known. Then, the inventors of the present invention have studied the N region further in detail by the Cu deposition method, and found that a region where defects detected by Cu deposition treatment generate remarkably exists in N region of the outside of an OSF region, which is a part of the Nv region where oxygen precipitation is apt to be caused after a heat treatment for the precipitation.

Furthermore, they have found that this is a cause of degradation of electrical characteristics such as oxide dielectric breakdown voltage characteristics or the like.

Accordingly, if the region which is an N region of the outside of the OSF and has no defect region detected by Cu deposition can be extended all over a wafer, the wafer which does not have the above-mentioned various grown-in defects, and has surely improved oxide dielectric breakdown voltage characteristics or the like can be obtained.

The inventors conducted the following experiments to know the relation between a growth rate and a defect distribution, grew a single crystal ingot based on the result thereof, and evaluated the oxide dielectric breakdown voltage characteristics of the wafer.
(Experiment 1)

Figure 2:
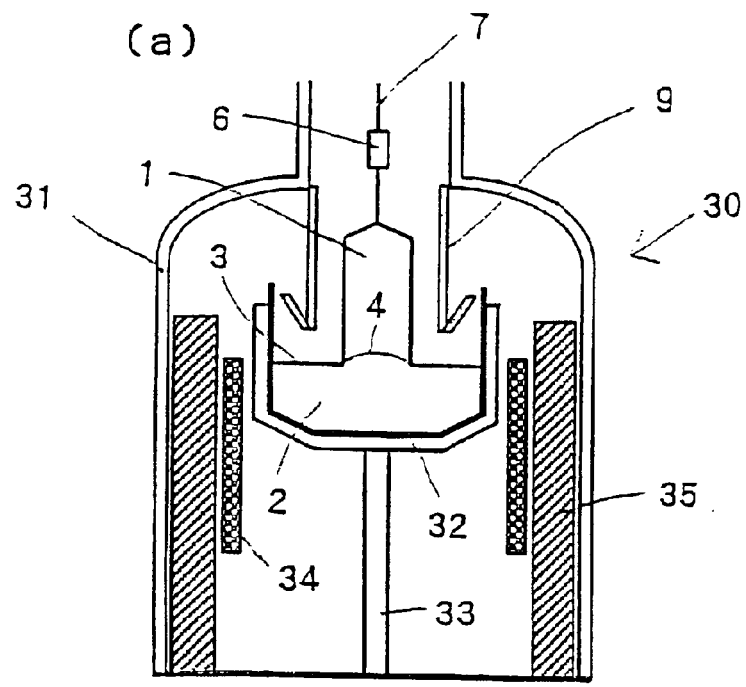
FIG. 2 is a schematic view of the single crystal pulling apparatus used in the present invention.
Figure 2:
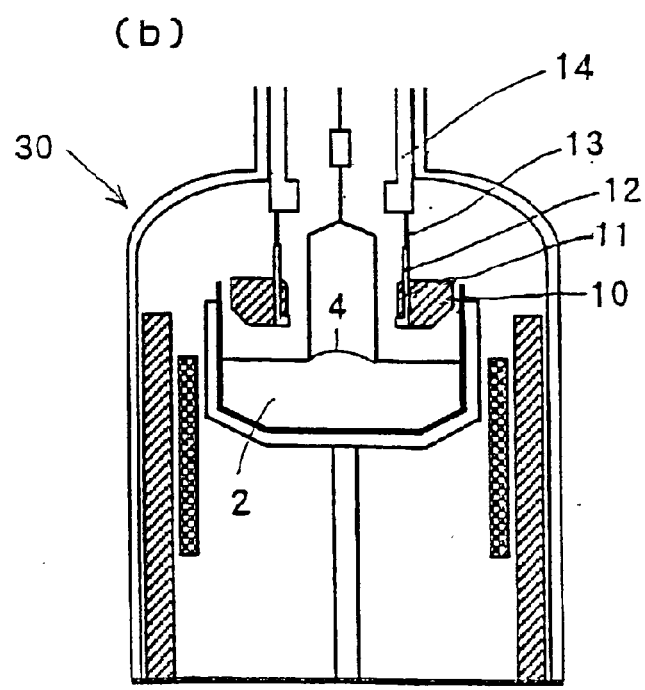

The MCZ single crystal pulling apparatuses (a horizontal magnetic field is applied) shown as Apparatus A of FIG. 2(a) and Apparatus B of FIG. 2(b) were used. In Apparatus A 150 kg of polycrystal silicon as raw material was charged into a 24 inch quartz crucible. In Apparatus B, 160 kg of polycrystal silicon as raw material was charged into a 26 inch quartz crucible. Then, a silicon single crystal with a diameter of 8 inches (diameter of 200 mm) and orientation <100> was pulled using each of the apparatuses. When pulling the single crystal, a growth rate was gradually lowered from a top to a tail of the crystal in the range of 0.7 mm/min to 0.3 mm/min. The crystal was produced so that the oxygen concentration in the wafer might be 22–23 ppma (ASTM'79 value).

As shown in FIGS. 3(a) and (b), the pulled crystal was cut parallel to the direction of the crystal growth axis from the head to the tail, to produce four wafer samples. Among four samples, three samples were tested as for distribution of each region of V region, an OSF region and I region, distribution of FPD and LEP, and OSF generation by OSF heat treatment, by WLT (wafer life time) measurement (measuring instrument: SEMILAB WT-85) and Secco etching, to check a growth rate at boundary of each region. One of the samples produced by cutting parallel to the direction of the crystal growth axis was cut in a shape of a wafer with a diameter of 6 inches as shown in FIG. 3(c), and a thermal oxide film was formed on the front surface of one of them after mirror finishing. Then, it was subjected to Cu deposition treatment, and a distribution of oxide-film defects was determined.

Detail of the evaluation procedure of the wafer and an evaluation result in this experiment will be given below.

(1) The pulled single crystal ingot was cut to blocks with length of 10 cm, each of which was then cut parallel to the direction of a crystal growth axis to provide four samples with a thickness of about 2 mm.

(2) One of the above samples was subjected to heat treatment at 620° C. for 2 hours under nitrogen atmosphere in a wafer heat treating furnace, to heat treatment at 800° C. for 4-hour (nitrogen atmosphere), and then to heat treatment at 1000° C. for 16 hour (under dry oxygen atmosphere). Then, it was cooled, and a map of wafer life time (WLT) was created using SEMILAB-85 (See FIGS. 4(a) and (b)). Moreover, the 2nd sample was subjected to mirror etching and then to Secco etching, and a distribution of FPD and LEP was observed. The 3rd sample was subjected to OSF heat treatment followed by Secco etching, to remove the oxide film, and a distribution of OSF was confirmed. From these result, each region of V region, an OSF region and I region was identified, and a growth rate at each boundary was investigated.

The growth rate (See FIG. 4(a)) at each boundary of the single crystal pulled with Apparatus A (FIG. 2(a)) was as follows.

| | |
|---|---|
| V region/OSF region boundary: | 0.484 mm/min, |
| OSF disappearing boundary: | 0.472 mm/min, |
| Cu deposition defect disappearing boundary: | 0.467 mm/min, |
| no precipitation N(Ni) region/I region boundary: | 0.454 mm/min. |

The growth rate (see FIG. 4(b)) at each boundary of the single crystal pulled with Apparatus B (FIG. 2(b)) was as follows.

| | |
|---|---|
| V region/OSF region boundary: | 0.596 mm/min, |
| OSF disappearing boundary: | 0.587 mm/min, |
| Cu deposition defect disappearing boundary: | 0.566 mm/min, |
| precipitation N(Nv) region/Ni region boundary: | 0.526 mm/min, |
| Ni region/I region boundary: | 0.510 mm/min. |

(3) A sample in a shape of a wafer with a diameter of 6 inches was cut out from one of the remaining samples produced in (1) by cutting the above-mentioned single crystal ingot parallel to the direction of a crystal growth axis (See FIG. 3(c)), and then subjected to mirror finishing. Then, a thermal oxide film was formed on the surface of the wafer, then subjected to Cu deposition treatment, and a distribution of oxide film defects was confirmed.

The evaluation conditions are as follows.

1) Oxide film: 25 nm,
2) electric field strength: 6 MV/cm,
3) time of applying voltage: for 5 minutes.

The results of evaluation of Nv region by Cu deposition were shown in FIG. 5.

FIG. 5(a) shows a defect distribution of the oxide film defect region generated by Cu deposition, and FIG. 5(b) shows a defect distribution of the Nv region having no oxide film defects by Cu deposition.

FIG. 6(a) shows a result of evaluation of oxide dielectric breakdown voltage of the Nv region where oxide-film defects were generated by Cu deposition, and (b) shows a result of evaluation of oxide dielectric breakdown voltage of the Nv region where oxide-film defects were not generated by Cu deposition.

From these results, it has been found that the defect region detected by Cu deposition where an oxide-film defect is apt to generate exists in the Nv region where oxygen precipitation is apt to be caused in the N region existing outside of OSF. Although it is the Nv region, an oxide dielectric breakdown voltage is not always good. On the other hand, it has been found that a satisfactory oxide dielectric breakdown voltage can be obtained in the Nv region where there is no defect region detected by Cu deposition, although it is also in the Nv region.
(Experiment 2)

Based on the above-mentioned results, using Apparatus B (FIG. 2(b)), a crystal was pulled with controlling a growth rate so that there might be obtained the region which is in N region outside of OSF, is not Cu deposition defect region (Dn region), and does not contain the Ni region where oxygen precipitation is hardly caused. The pulled crystal was processed to be a mirror finished wafer, and oxide dielectric breakdown voltage characteristics were evaluated.

The C-mode measurement conditions are as follows.

1) Oxide film : 25 nm,
2) measuring electrode: phosphorus doped polysilicon, 3) electrode area: 8 mm2 and
4) current density in decision: 1 mA/cm².

As a result, oxide dielectric breakdown voltage level as 100% of good chip yield can be achieved.

The inventors of the present invention have studied further based on the knowledge acquired in the above experiments, and completed the present invention.

The first method for producing a silicon single crystal of the present invention is characterized in that a crystal is grown in a defect-free region which belongs to N region of the outside of OSF generated in a shape of a ring when thermal oxidation treatment is carried out in which no defect region detected by Cu deposition exists.

The method will be explained below based on FIG. 1. The crystal is grown with controlling the growth rate between the growth rate of the boundary where the defect region detected by Cu deposition remaining after disappearance of OSF ring is disappeared when gradually decreasing a growth rate of silicon single crystal during pulling and the growth rate of the boundary where interstitial dislocation loop is generated when a growth rate is gradually lowered further.

The wafer cut out from the single crystal ingot pulled by the method described above can be a defect-free silicon single crystal wafer wherein whole plane of the wafer is occupied by the N region of the outside of OSF generated in a shape of a ring when thermal oxidation is conducted, and the defect region which is detected by Cu deposition does not exist at all.

The second method for producing is characterized in that a crystal is grown in the region which is N region on the outside of OSF generated in a shape of a ring by thermal oxidation treatment and in the range in which there exists neither defect region detected by Cu deposition nor Ni region where oxygen precipitation is hardly caused.

The method will be explained below based on FIG. 1. The crystal is grown with controlling the growth rate between the growth rate of the boundary where the defect region detected by Cu deposition remaining after disappearance of OSF ring is disappeared when gradually decreasing a growth rate of silicon-single crystal during pulling and the growth rate of the boundary where the Ni region in which oxygen precipitation is hardly caused is generated when a growth rate is gradually lowered further.

The wafer produced from the single crystal ingot pulled by the method described above can be a defect-free silicon single crystal wafer wherein whole plane of the wafer is occupied by the N region of the outside of OSF generated in a shape of a ring when thermal oxidation is conducted, and there exists in the whole plane of the wafer neither the defect region detected by Cu deposition nor Ni region where oxygen precipitation is hardly caused.

Since the wafer does not contain the Ni region where oxygen precipitation is hardly caused, and consists only of Nv region, an oxide precipitate layer is formed in a bulk when defect-free region is subjected to heat treatment in an atmosphere of nitrogen and dry oxygen. Accordingly, a silicon single crystal wafer produced from the region is excellent not only in oxide dielectric breakdown voltage or the like, but also in a gettering performance.

When the product of the present invention is produced, the defect-free region of the present invention, especially the region where the oxide precipitate layer is formed (Nv-Dn) is enlarged more by using a CZ pulling machine having a rapid cooling function which enables pulling of a silicon single crystal at a growth rate of 0.5 mm/min or higher, and thereby stability in manufacture can be achieved.

When using a CZ pulling apparatus wherein temperature gradient in axial direction Gc of the crystal solid-liquid interface at the center part in the crystal is small, and a growth rate higher than 0.5 mm/min cannot be achieved in production of the defect-free region of the present invention, mass production was not easy since a margin of growth rate of a silicon single crystal as raw material of the present invention is lower than 0.02 mm/min. However, when using a CZ pulling apparatus wherein Gc is large and a growth rate of 0.5 mm/min or more can be achieved when the defect-free region of the present invention is produced, the margin of the growth rate of a silicon single crystal of the present invention as a raw material was 0.02 mm/min or more, and was about 0.05 mm/min at the highest. Especially, in the case of producing the product of the present invention at a growth rate of 0.5 mm/min or higher, a margin of growth rate in the region wherein a oxide precipitate layer is formed in the bulk after heat treatment in an atmosphere of nitrogen and dry oxygen can be enlarged easily.

Finally, an example of the CZ method single crystal pulling apparatus used for the present invention will be explained below referring to FIGS. 2(a) (b). As shown in FIG. 2(a), an apparatus 30 for pulling a single crystal includes a pulling chamber 31, a crucible 32 provided in the pulling chamber 31, a heater 34 disposed around the crucible 32, a crucible-holding axis 33 for rotating the crucible 32 and a rotation mechanism (not shown) therefor, a seed chuck 6 for holding a silicon seed crystal, a wire 7 for pulling the seed chuck 6, and a winding mechanism (not shown) for rotating and winding up the wire 7. The crucible 32 includes an inner quartz crucible for containing a silicon melt 2 and an outer graphite crucible located outside the quartz crucible. A heat insulating material 35 is disposed around the heater 34.

In order to establish operating conditions for the production method of the present invention, an annular graphite cylinder (heat insulating plate) 9 is provided. In the apparatus shown in FIG. 2(b), an annular outer heat insulating material 10 is provided around the solid-liquid interface 4 of the single crystal. The heat insulating material 10 is disposed such that a gap of 2–20 cm is formed between the lower end thereof and the surface 3 of the silicon melt 2. Furthermore, there may be provided a tubular cooling device for cooling the single crystal by jetting a cooling gas or by shutting off radiant heat.

Recently, there may be used in many cases, a method wherein magnets (not shown) are provided outside horizontally of the pulling chamber 31, and a magnetic field such as a horizontal magnetic field, vertical magnetic field or the like is applied to the silicon melt 2, to achieve control of melt convection and stable growth of single crystal, which is called MCZ method.

A method for growing single crystal using the above-mentioned single crystal pulling apparatus 30 will be explained below.

First, a highly pure polycrystalline material of silicon is heated to its melting point (approximately 1420° C.) or higher and is thus melted in the crucible 32. Then, the wire 7 is released until a tip end of the seed crystal comes into contact with the surface of the melt 2 at an approximately central portion or is immersed therein. Subsequently, the crucible holding shaft 33 is rotated in an appropriate direction, and the wire 7 is wound up with being rotated at the same time to pull the seed crystal, and thereby growth of the single crystal is initiated. Then, through adequate regulation of the pulling rate and temperature, an approximately cylindrical single crystal ingot 1 can be obtained.

In that case, it is especially important for the achievement of the objects of the present invention that, as shown in FIG. 2(a) or FIG. 2(b), the annular graphite cylinder 9 (heat insulating plate) or the outer heat insulating material 10 surrounding the liquid portion of the single crystal ingot 1 above the surface of the melt in the pulling chamber 31 is disposed, so that the temperature zone of a melting point of crystal to 1400° C. near the surface of the melt can be controlled.

Namely, the temperature in the furnace can be controlled by providing the outer insulating material 10 in the pulling chamber 31 such that a gap of 2–20 cm is formed between the lower end thereof and the surface of the silicon melt. Thereby, the temperature in the furnace can be controlled so that the difference between the temperature gradient Gc [° C./cm] at the center of a crystal and the temperature gradient Ge [° C./cm] at the circumferential portion of the crystal may be smaller, namely the temperature gradient at the circumferential portion of the crystal may be lower than the temperature gradient at the center of a crystal.

This outer heat insulating material 10 is on the outside of the graphite cylinder 12, and the heat insulating cylinder 11 is also provided inside the graphite cylinder 12. Moreover, the top of the graphite cylinder 12 is connected with a metal cylinder 13, and a cooling cylinder 14 is provided thereon, in which cooling medium is allowed to flow for forced cooling.

The silicon single crystal wafer produced by slicing the silicon single crystal manufactured by the method for producing the silicon single crystal described above is a defect-free wafer which belongs to N region on the outside of OSF generated in a shape of a ring by thermal oxidation treatment in which no defect region detected by Cu deposition exists. Alternatively, it is a defect-free wafer which belongs to N region on the outside of OSF generated in a shape of a ring by thermal oxidation treatment in which neither a defect region detected by Cu deposition nor Ni region where oxygen precipitation is hardly caused exists in the whole plane of the wafer.

The present invention is not limited to the above-described embodiment. The above-described embodiment is a mere example, and those having the substantially same structure as that described in the appended claims and providing the similar action and effects are included in the scope of the present invention.

For example, in the above-described embodiment, the silicon single crystal having a diameter of 8 inches was grown. However, the present invention can be applied to a method of pulling a crystal recently produced having larger diameter, for example, 10 to 16 inches, or more. Furthermore, the present invention can also be applied to a method in which a horizontal magnetic field, a vertical magnetic field or a cusp magnetic field is applied to silicon melts, so-called MCZ method.

What is claimed is:

1. A silicon single crystal wafer grown according to Czochralski method wherein the whole plane of the wafer is occupied by N region on the outside of OSF generated in a shape of a ring by thermal oxidation treatment and there exists no defect region detected by Cu deposition.

2. A silicon single crystal wafer grown according to Czochralski method wherein the whole plane of the wafer is occupied by N region on the outside of OSF generated in a shape of a ring by thermal oxidation treatment and there exists in the whole plane of the wafer neither a defect region detected by Cu deposition nor Ni region where oxygen precipitation is hardly caused.

3. A method for producing a silicon single crystal according to Czochralski method wherein the crystal is grown in a defect-free region which is N region on the outside of OSF generated in a shape of a ring when the grown silicon single crystal wafer is subjected to thermal oxidation treatment in which a defect region detected by Cu deposition does not exist.

4. A method for producing a silicon single crystal according to the Czochralski method wherein the crystal is grown with controlling a growth rate between the growth rate of the boundary where the defect region detected by Cu deposition remaining after disappearance of OSF ring is disappeared when gradually decreasing a growth rate of silicon single crystal during pulling and the growth rate of the boundary where interstitial dislocation loop is generated when a growth rate is gradually lowered further.

5. A method for producing a silicon single crystal according to Czochralski method wherein the crystal is grown in a defect-free region which is N region on the outside of OSF generated in a shape of a ring when the grown silicon single crystal wafer is subjected to thermal oxidation treatment in which neither a defect region detected by Cu deposition nor Ni region where oxygen precipitation is hardly caused exists.

6. A method for producing a silicon single crystal according to the Czochralski method wherein the crystal is grown with controlling a growth rate between the growth rate of the boundary where the defect region detected by Cu deposition remaining after disappearance of OSF ring is disappeared when gradually decreasing a growth rate of silicon single crystal during pulling and the growth rate of the boundary where the Ni region in which oxygen precipitation is hardly caused is generated when a growth rate is gradually lowered further.

7. The method for producing a silicon single crystal according to claim 3 wherein a pulling rate at the time of a crystal growth is 0.5 mm/min or more.

8. The method for producing a silicon single crystal according to claim 4 wherein a pulling rate at the time of a crystal growth is 0.5 mm/min or more.

9. The method for producing a silicon single crystal according to claim 5 wherein a pulling rate at the time of a crystal growth is 0.5 mm/min or more.

10. The method for producing a silicon single crystal according to claim 6 wherein a pulling rate at the time of a crystal growth is 0.5 mm/min or more.

* * * * *